(12) United States Patent
Dils et al.

(10) Patent No.: US 6,319,732 B1
(45) Date of Patent: Nov. 20, 2001

(54) METHOD FOR CONTROLLING THE TEMPERATURE OF A LAYER GROWING ON A WAFER

(75) Inventors: Ray Dils, Vancouver, WA (US); Robert D. Meadows, Portland, OR (US)

(73) Assignee: Sekidenko, Inc., Vancouver, WA (US)

(*) Notice: Subject to any disclaimer, the term of this patent is extended or adjusted under 35 U.S.C. 154(b) by 0 days.

(21) Appl. No.: 09/341,954

(22) PCT Filed: Jan. 20, 1998

(86) PCT No.: PCT/US98/01523

§ 371 Date: Oct. 25, 1999

§ 102(e) Date: Oct. 25, 1999

(87) PCT Pub. No.: WO98/32165

PCT Pub. Date: Jul. 23, 1998

Related U.S. Application Data

(60) Provisional application No. 60/036,142, filed on Jan. 21, 1997.

(51) Int. Cl.[7] .............................. H01L 21/00; H01L 21/66
(52) U.S. Cl. .................................... 438/7; 438/16
(58) Field of Search .................... 438/16, 14, 7; 250/252.1

(56) References Cited

U.S. PATENT DOCUMENTS

| | | | |
|---|---|---|---|
| 4,203,799 | * | 5/1980 | Sugawara et al. . |
| 5,118,200 | * | 6/1992 | Kirillov et al. . |
| 5,568,978 | * | 10/1996 | Johnson et al. . |
| 5,769,540 | * | 6/1998 | Schietinger et al. . |
| 5,830,277 | * | 11/1998 | Johnsgard et al. . |

\* cited by examiner

*Primary Examiner*—Charles Bowers
*Assistant Examiner*—Evan Pert
(74) *Attorney, Agent, or Firm*—Chernoff, Vilhauer, McClung & Stenzel, LLP

(57) ABSTRACT

A method for controlling the temperature of a growing semitransparent layer (12) during a production deposition process on a major surface of a production wafer (14). During the production process heat is applied to the wafer by an intensity adjustable heat source (34) and the production wafer emits a broad spectrum of light. In the method a test deposition process is performed using a set of infrared wavelengths of the light emitted from a test wafer to determine a set of test parameter values including temperature values over time for the test growing layer. The production deposition process is then performed and the intensity of infrared light emissions from the wafer are measured to form a set of production infrared light intensity values at the same test run set of infrared wavelengths used in the test deposition. The production infrared light intensity values and the set of test parameter values are used to compute an error correction value that is used to correct the intensity of the heat source during the production deposition.

6 Claims, 8 Drawing Sheets

METHOD FOR CONTROLLING THE TEMPERATURE OF A LAYER GROWING ON A WAFER

The present application claims priority from and incorporates-by-reference application Ser. No. 60/036,142, filed Jan. 21, 1997.

TECHNICAL FIELD

BACKGROUND ART

The present invention is a method for measuring and controlling the temperature of a semitransparent layer during its deposition onto a semiconductor wafer. During its deposition this layer will be referred to as a "growing layer."

Accurate control of the temperature of a growing layer is essential to the production of a high quality semiconductor device product. Changes in temperature during the deposition process cause variations in the thickness and crystal structure of the resultant finished layer. As the dimensions of active elements and leads has continued to decrease in modern integrated circuits, the importance of accurately controlling the thickness of the several layers which compose a semiconductor device structure has steadily increased. Techniques in which a wafer is moved sequentially through a series of reaction chambers, each designed to treat a single wafer at a time ("single wafer processing techniques") have been developed to obtain smaller device geometries. Unfortunately, accurate temperature control in a single wafer reaction chamber, which is designed to quickly reach a very high temperature, is difficult to achieve for reasons explained below.

Essential to the control of the growing layer temperature is the accurate measurement of the growing layer temperature. The growing layer can not be physically contacted by a temperature sensor because to do so would affect the heat transfer near the point of contact and corrupt the measurement. Efforts to remotely measure the surface temperature have centered on the measurement of infrared light (IR).

For all solids the amount of light that is emitted (radiated) from a surface is related to the temperature of the surface by a parameter known as emissivity. For an opaque solid emissivity does not change with thickness and is a constant having a value of up to 1.0 depending on the type of material. For example, a bare silicon wafer surface has an emissivity of 0.66 to 0.68.

As a growing layer of semitransparent material is deposited on a silicon wafer, the emissivity of the surface changes with growing layer thickness due to optical interferences from reflections at the wafer surface, underlying layer surfaces and the growing layer surfaces. At a single wavelength used to measure the temperature, the emissivity can vary by as much as 0.2–0.9 leading to measurement errors of several tens of degrees. The variation of the emissivity also affects the heat losses radiated from the front surface of the wafer. If the temperature is not measured and used to adjust the heat supplied to the wafer to compensate for the changes in the thermal radiation from the front surface of the wafer, the wafer temperature can vary by as much as 20 degrees Celsius. In these types of depositions, and in most semiconductor processing, a temperature control within a few degrees Celsius is required.

Three basic approaches have been taken to overcome the problems posed in trying to determine temperature by measuring IR light intensity in a test environment of changing emissivity. The original approach utilized a broad band of light between 600 and 1000 nm to attempt to average the variations of surface emissivity at each wavelength caused by variation in the degree of constructive and destructive interference in the growing layer.

The second approach attempts to measure emissivity by shining an active light source at the same wavelength used to measure temperature at the wafer surface and measuring the reflected light. Since the emissivity plus the reflectivity of a surface must equal one, the emissivity of the surface is deduced from the value of the reflectivity. When the emissivity is known, the temperature can be easily obtained from the amount of light emitted from the surface in the absence of the incident light. The difficulty with this technique is that the measured reflectivity is a strong function of the roughness of the surface and patterned process wafer surfaces become quite rough as sequential layers are deposited. Due to this surface roughness, the incident light rays are reflected in many directions and the light reflected into the measuring optics is not predictably related to the emissivity of the surface by a simple equation. Efforts to date have had limited success.

The third approach uses an active light source with wavelengths which are different than the wavelength used to measure the temperature. In this case, many wavelengths are used and analytical models of interferences in multiple layer structures are used to compute the thickness of the growing layer. From this thickness, the emissivity of the surface at the measured wavelength is calculated and used in the temperature measurement. The errors in this approach arise from the accuracy of the analytical models, particularly for the complicated structures found on practical wafers where the device patterns cover the entire wafer surface. Even in the absence of the patterned surfaces, lack of information on the optical properties of the growing layer and the layers underneath the growing layer causes these analytically based approaches to have limited application. In order to model the optical events near the wafer surface accurately, the investigator must know the index of refraction and optical absorption of each layer at the deposition temperature and measured wavelength. In general, this information is not available.

What is, therefore, needed but not yet available is a method for accurately controlling the temperature of a layer of semitransparent material that is being deposited on a semiconductor wafer.

DISCLOSURE OF THE INVENTION

The present invention is a method for controlling the temperature of a growing semitransparent layer during a production deposition process onto a major surface of a production wafer. During the deposition process, heat is applied to the wafer by an intensity adjustable heat source. The production wafer emits a broad spectrum of light during the process. The method first comprises performing a test deposition process using a test wafer to create a test growing semitransparent layer. The test wafer and the test deposition process are prospectively identical to the production wafer and the production deposition process except for that heat is applied to the test wafer according to a test heat application schedule. First, a set of measurements over time of the intensity of infrared light emissions from the test growing layer at a predetermined set of infrared wavelengths are formed. Then these measurements are used to determine a set of test parameter values.

During the production deposition process, infrared light intensity is measured at the set of infrared wavelengths used in the test deposition process. These values, together with the set of test parameter values that are used to originate an error correction value that is used to adjust the intensity of the intensity adjustable heat source.

The foregoing and other objectives, features, and advantages of the invention will be more readily understood upon consideration of the following detailed description of the invention, taken in conjunction with the accompanying drawings.

BEST MODES FOR CARRYING OUT THE INVENTION

Figure 1:
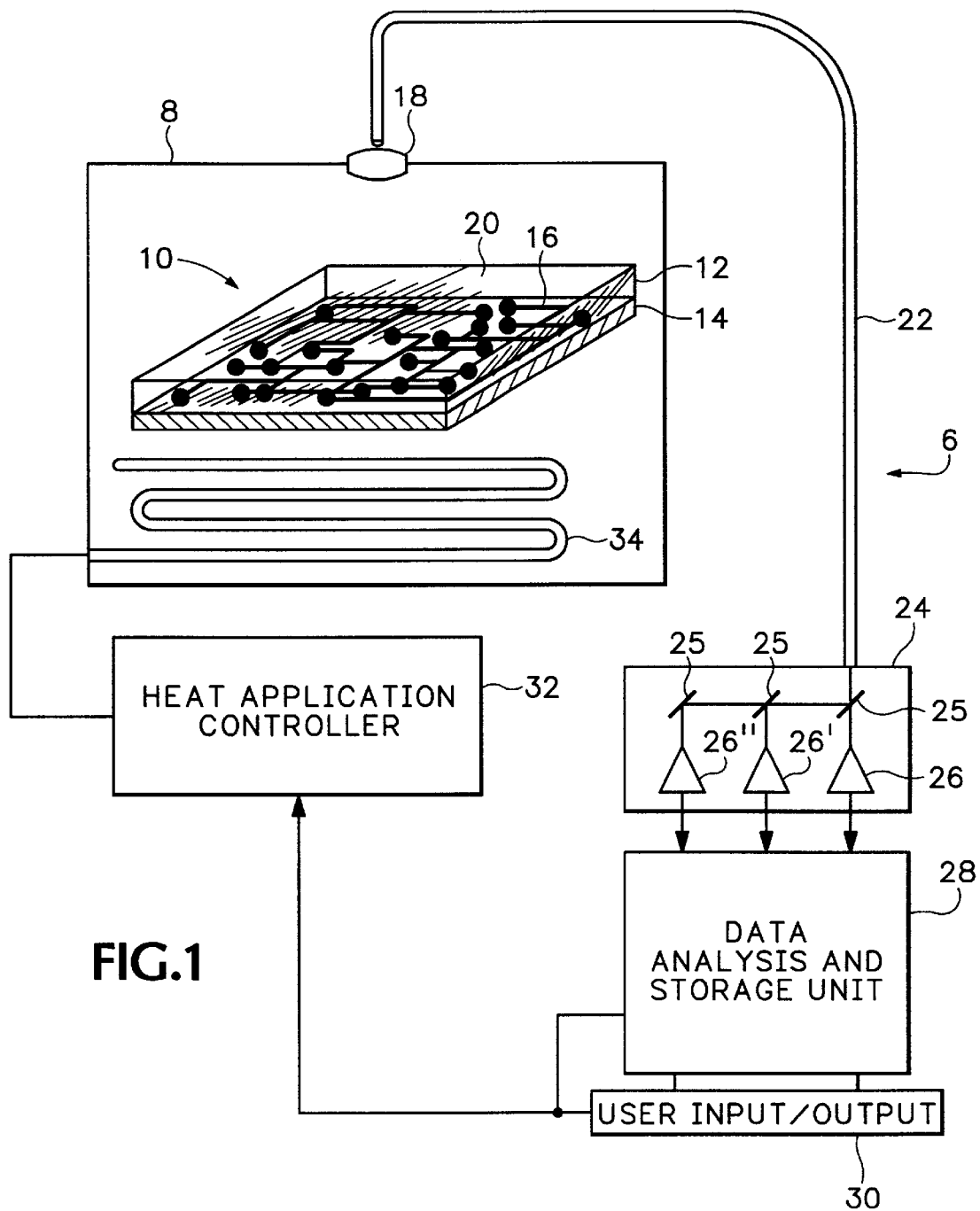
FIG. 1 is an illustration of a test configuration for gathering data as part of the method of the present invention.

FIG. 1 shows a test configuration 6 that may be used to practice a preferred embodiment of the present invention. A reactor 8 permits deposition of additional layers onto a wafer 10. Specifically, a growing semitransparent layer 12 consists of material being deposited onto a silicon base layer 14. Typically, an electrically conductive material pattern 16 is interposed between layer 14 and layer 12. A lens 18 is focused to receive light emanating at a 90° angle from a predetermined portion of a top surface 20 of wafer 10. The 90° angle reduces the complexity of reflections from traces 16 which would otherwise complicate the measurement process.

A fiber optic cable 22 transmits light from lens 18 to a light measurement device 24 having a set of beam splitters 25 and a set of light detectors 26, 26' and 26" (typically pyrometers) usually filtered to detect infrared light at a wavelength of 950, 870 and 800 µm respectively. The data from detector 26 (and in one embodiment 26' and 26") is analyzed in a data analysis and storage unit 28, having a user input/output device 30. Unit 28 may be a standard microcomputer, appropriately programmed. The results of this process may be used to adjust the operation of a heat application controller 32, which controls a wafer heater 34.

To begin the preferred method, a best estimate heat application schedule is derived by a systems engineer. This schedule is the engineer's best estimate of the heat application necessary to keep wafer 10 and layer 12 at an ideal temperature during the deposition process. The heat application schedule is input into and stored in data analysis and storage unit 28 and is applied to heat application controller 32 during the deposition process.

After this, a test or "golden" wafer deposition process is performed and IR intensity data is gathered at three different IR wavelengths by light detectors 26, 26' and 26" and recorded into data analysis and storage unit 28. The three IR wavelengths typically are 800, 870 and 950 nm for higher temperatures and 870, 950 and 1020 nm for lower temperatures. Selection of the wavelengths is determined by three factors: 1) the wavelengths should be as far apart from one another as possible; 2) adequate light should be emitted at the shortest wavelength; 3) the wavelengths and the intervals between the wavelengths should not be integral multiples of each other. The golden wafer growing layer is typically slightly thicker than the production wafer growing layer to provide more data for analysis.

Figure 2:
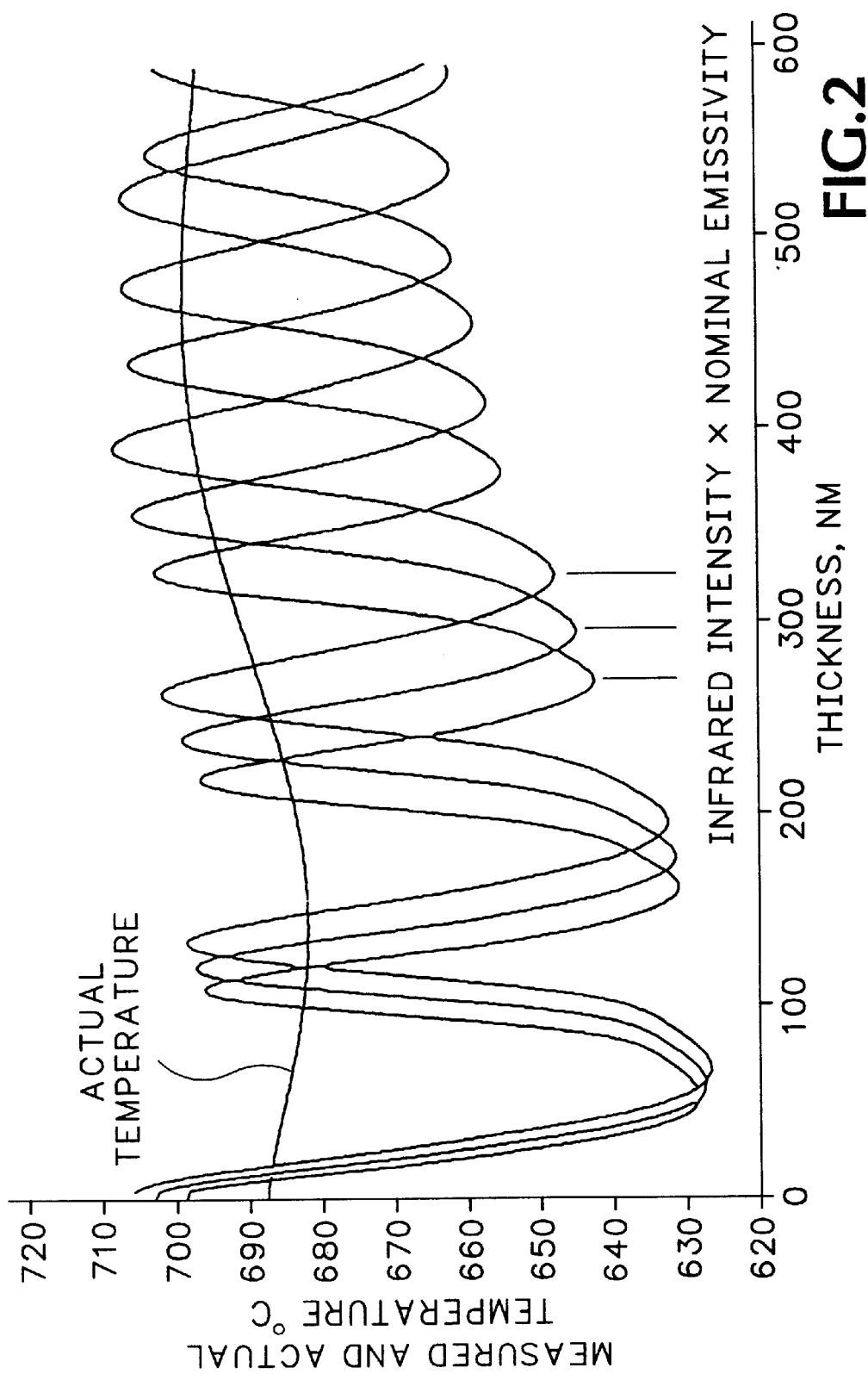
FIG. 2 is a graph of infrared intensity measurements (translated to a temperature scale by a nominal emissivity) as a function of growing layer thickness and actual layer temperature.

A post analysis of the infrared intensity data (see FIG. 2) yields a set of test parameter values including a table relating, for an ideal temperature, differences in intensity between the three wavelength pairs formable from the three wavelengths, to growing layer 12 thickness. This permits growing layer 12 thickness to be determined during production deposition, by measuring infrared intensity at the same wavelengths used to form the table, finding the intensity differences between the wavelength pairs and doing a table lookup. After this, at least one wavelength intensity is compared to its ideal temperature value, an error correcting value is generated and controller 32 can adjust the heat output of heater 34 in response.

In the first step of the post analysis, the index of refraction of layer 12 is determined by measuring the thickness of finished layer 12 with an ellipsometer and solving equation 1 for index of refraction at the deposition temperature.

$$\phi=(4/\lambda)n\pi hp(\cos\theta)+(4/\lambda)n\pi hp(\cos\theta) \quad (1)$$

where,

φ=phase delay, radians

λ=wavelength, nm p=term order (eg, 1, for one double traverse of light from the wafer across growing layer 12 h=thickness of layer 12 n=refractive index of growing layer 12

θ=angle of measurement, relative to surface 20

The phase delay, φ, may be determined by counting the number of interference oscillations and any fractional portion thereof and multiplying by 2π. In some cases the interference oscillations may stop occurring, due to increasing opacity of the layer 12, before the end of the process. In this case the rate of growth of layer 12, as indicated by the interference oscillations, may be extrapolated to the end of the process. If there is some reason to believe that index of refraction may be a function of layer 12 thickness, several trial depositions may be performed to produce deposited layers of differing thicknesses which may be measured and correlated with interference oscillations. After the determination of the index of refraction, the interference oscillations may be translated into thickness as a function of time (using equation 1) and the infrared light intensity data are made a function of layer 12 thickness (rather than time).

Figure 3:
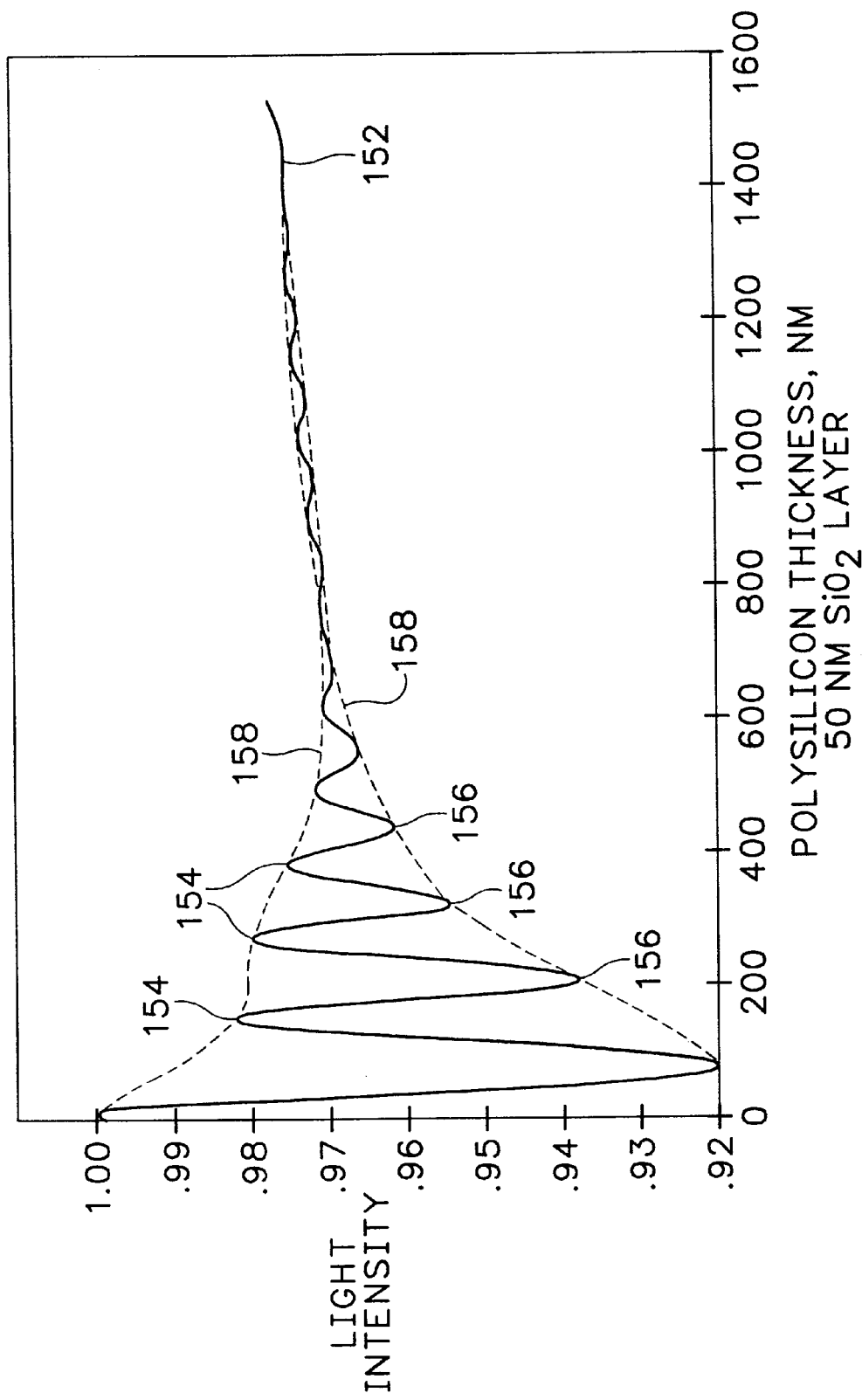
FIG. 3 is a graph of infrared light intensity and the envelope of infrared light intensity both shown as a function of growing layer thickness.
Figure 4:
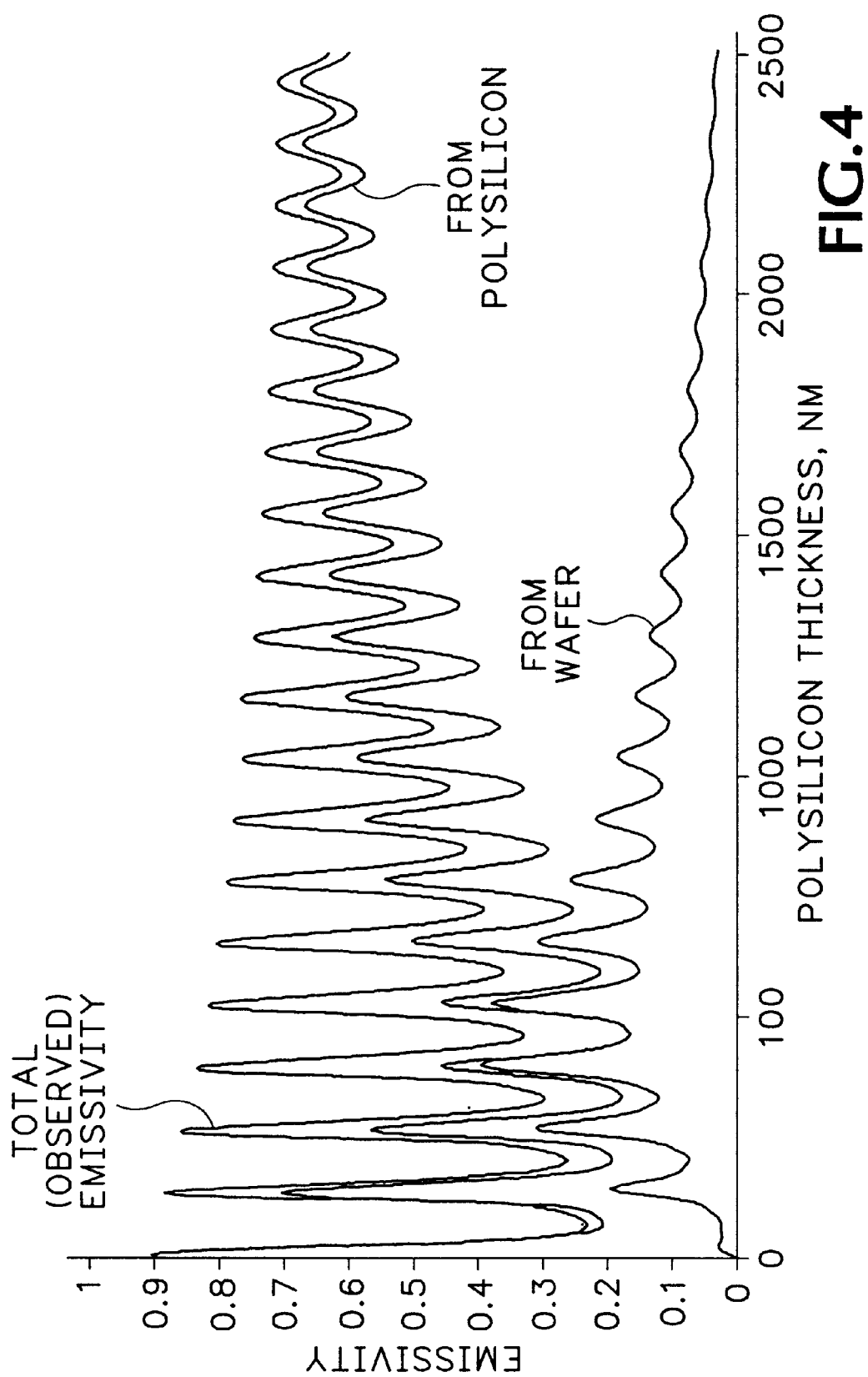
FIG. 4 is a graph of total emissivity, emissivity of light from the underlying wafer and emissivity of light from the growing layer, all shown as a function of growing layer thickness.
Figure 5:
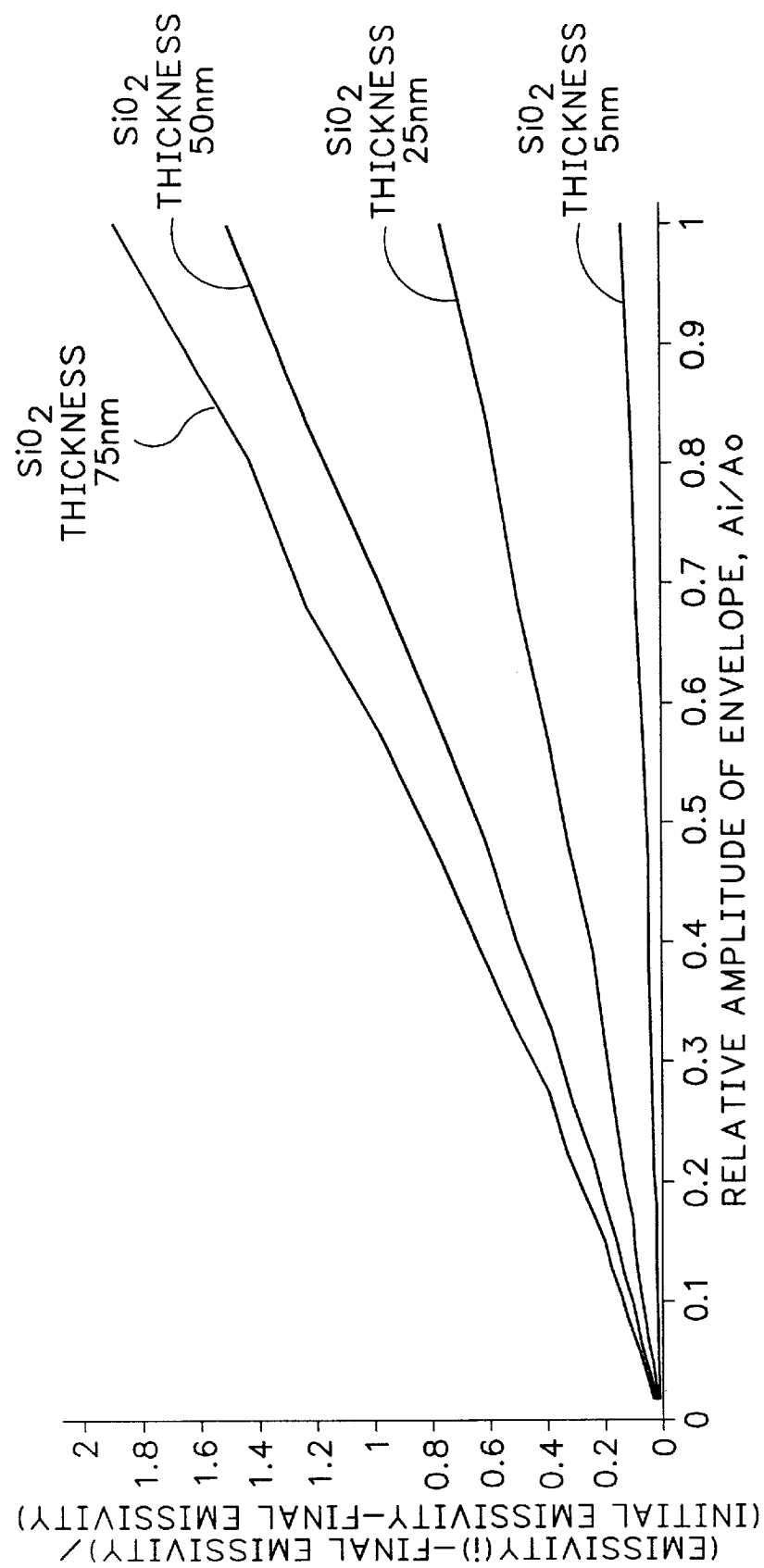
FIG. 5 is a graph of emissivity at the infrared intensity maxima as a function of relative infrared light intensity envelope amplitude for several different values of $SiO_2$ thickness.

Referring to FIG. 3, the post processing of the IR intensity versus time curve 152 (FIG. 4) begins with the determination of a set of interference oscillation maxima 154 and minima 156. A spline fit is performed on the magnitude of these points to determine the envelope magnitude curve 158 of the maxima 154 and minima 156. The envelope magnitude 158 yields the absorption coefficient of growing layer 12 through equation 2.

$$A_h = A_o \exp(-\alpha h) \quad (2)$$

where:

$A_o$=initial amplitude of envelope h=thickness of layer, nm $A_h$=amplitude of envelope at thickness h α=absorption coefficient of the measured wavelength at the deposition temperature The next step in the process is to use the empirically determined values of index of refraction and absorption coefficient at each wavelength in an analytical computer program (App. 1) which computes the emissivity of the surface of growing layer 12 as a function of thickness. The composition of the underlying structure has a great effect on the way in which the absorption coefficient, index of refraction and thickness of layer 12 translate to emissivity (see FIG. 4). Therefore, the underlying structure is modeled in gross as part of the analytical computer which is constructed according to standard optical principles that model light travel through growing layer 12 and underlying layers. More than one type of structure underlying the portion of growing layer 12 that is within the field of view of lens 18 may be modeled by the program. Inaccuracies in the model of the underlying structure could produce some inaccuracy in the final temperature measurement, potentially causing the production temperature control to be somewhat inaccurate. Moreover this error contribution is minimized by use of the maxima infrared intensity values as explained below, however, removing much of the uncertainty from the production process.

From the emissivities' values at the maxima and the infrared light intensity measurements, estimated temperature is computed. For the case of polysilicon deposition, 0.68 is near the emissivity of the finished layer 12, which is substantially opaque.

Figure 6:
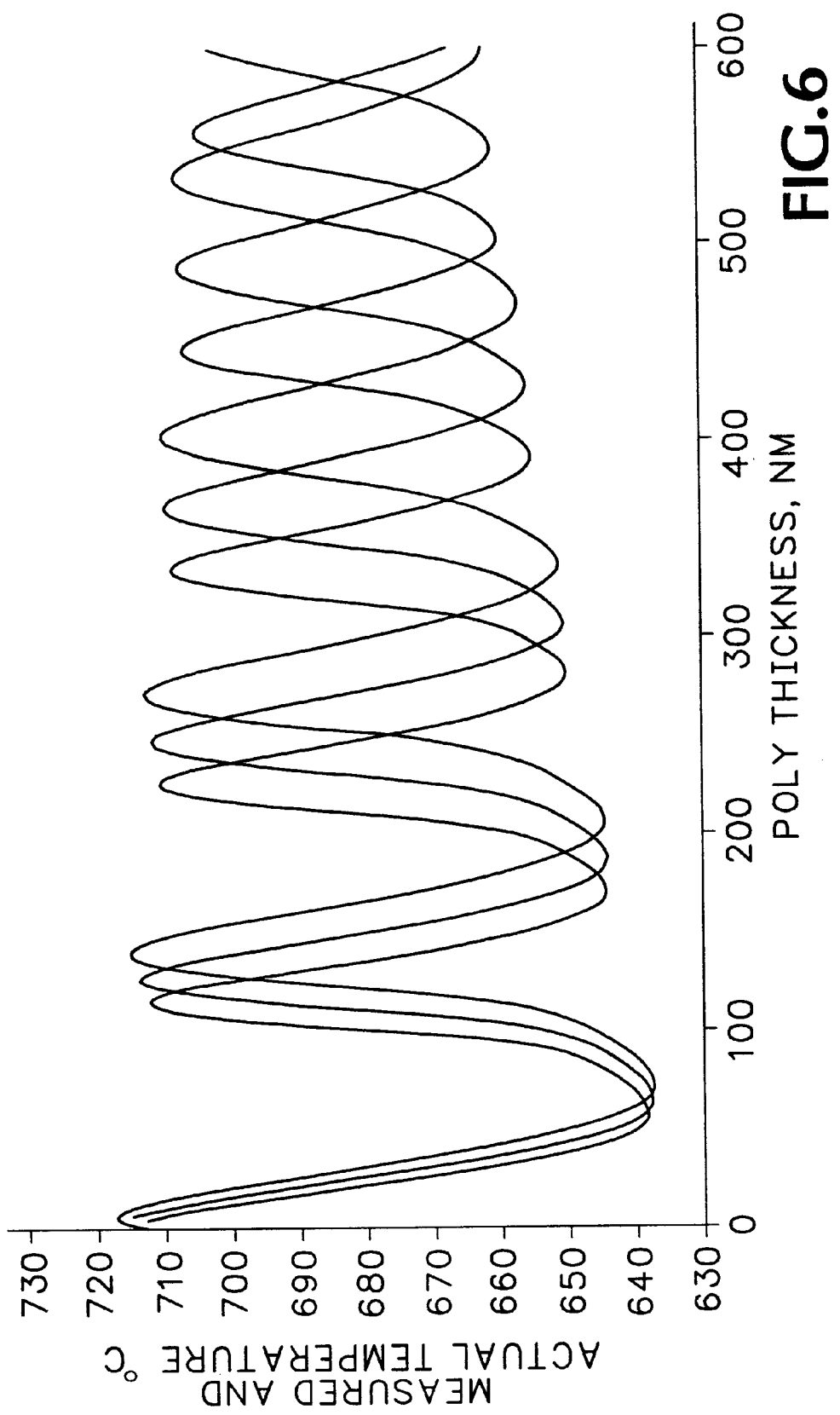
FIG. 6 is a graph of infrared light intensity translated to a temperature scale by a constant nominal emissivity and corrected for the effects of temperature variations in measured data.

The expected values of infrared light intensity corrected for a constant ideal deposition temperature are also computed for each measurement wavelength. This is done by fitting a spline curve to the temperature values computed at the maxima of the measured infrared intensity oscillations. This curve properly scaled is subtracted from a spline fit curve of the maxima of the infrared intensity values to obtain the variation in infrared intensity due to variation in temperature during the deposition. These variations are then subtracted from the experimental data at every data point to obtain estimated infrared intensity values for a deposition at constant temperature (the "corrected values", see FIG. 6).

In this manner, all the infrared intensity measurements provided by the golden wafer are preserved and the corrected golden wafer data can be used to measure and control the temperatures during deposition on subsequent wafers.

The infrared intensity maxima are used because the maxima are easy to identify and are stable. Moreover, they are not a strong function of the composition of underlying layers or growing layer 12. In addition, as can be seen from FIG. 2, the variation of the values of emissivity at the maxima vary from only 0.9 to 0.68 (25%) rather than 0.9 to 0.2 (78%). Further, the slope of the infrared intensity curve equals zero at its maxima, resulting in smaller error translation from intensity to temperature. Accordingly, by using the maxima values, errors caused by faulty modeling of underlying layers and inaccurate infrared intensity measurements are minimized.

Figure 7:
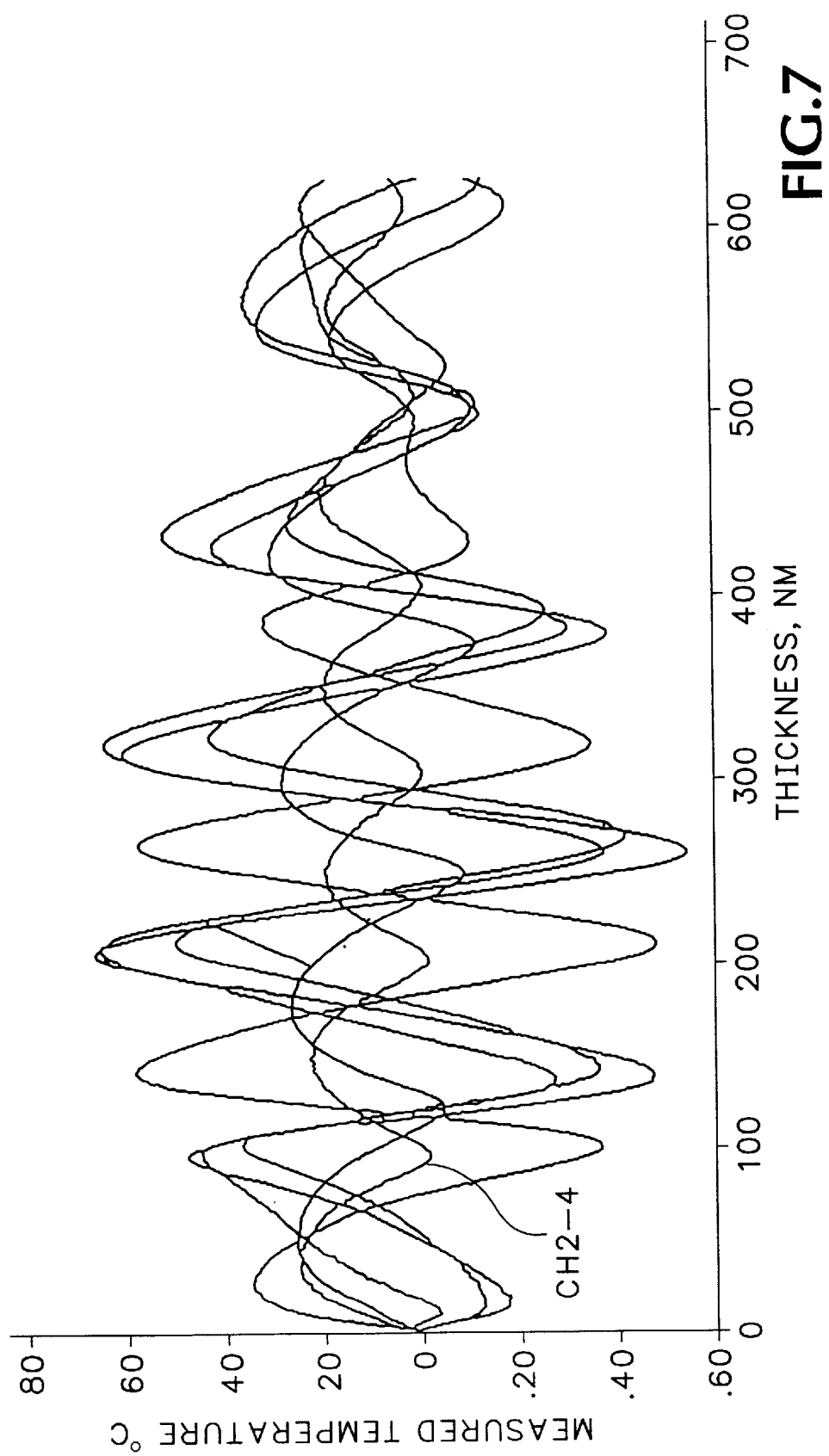
FIG. 7 is a graph of infrared light intensity differences, for four different wavelengths, translated to a temperature scale by a constant nominal emissivity and corrected for the effects of temperature variation in the measured data.

A table of ideal temperature infrared intensity difference values is computed for each wavelength pair, i.e., Int(950)–Int(870), Int(950)–Int(800) and Int(870)–Int(800), for three tables in all. (Int[x]=Intensity of light a wavelength x.) Examples of difference data in graph form are presented in FIG. 7.

During wafer production, after the golden wafer, the thickness of growing layer 12 can be determined during deposition by searching the difference tables until a matching combination of temperature differences is found. Then, the temperature is found by multiplying infrared intensity by the nominal emissivity value and correcting by the value from FIG. 8 for the calculated thickness of layer 12. This temperature value is compared with ideal temperature to produce an error value that is provided to heat application controller 32, which works through standard principles to control the wafer heater 34.

Figure 8:
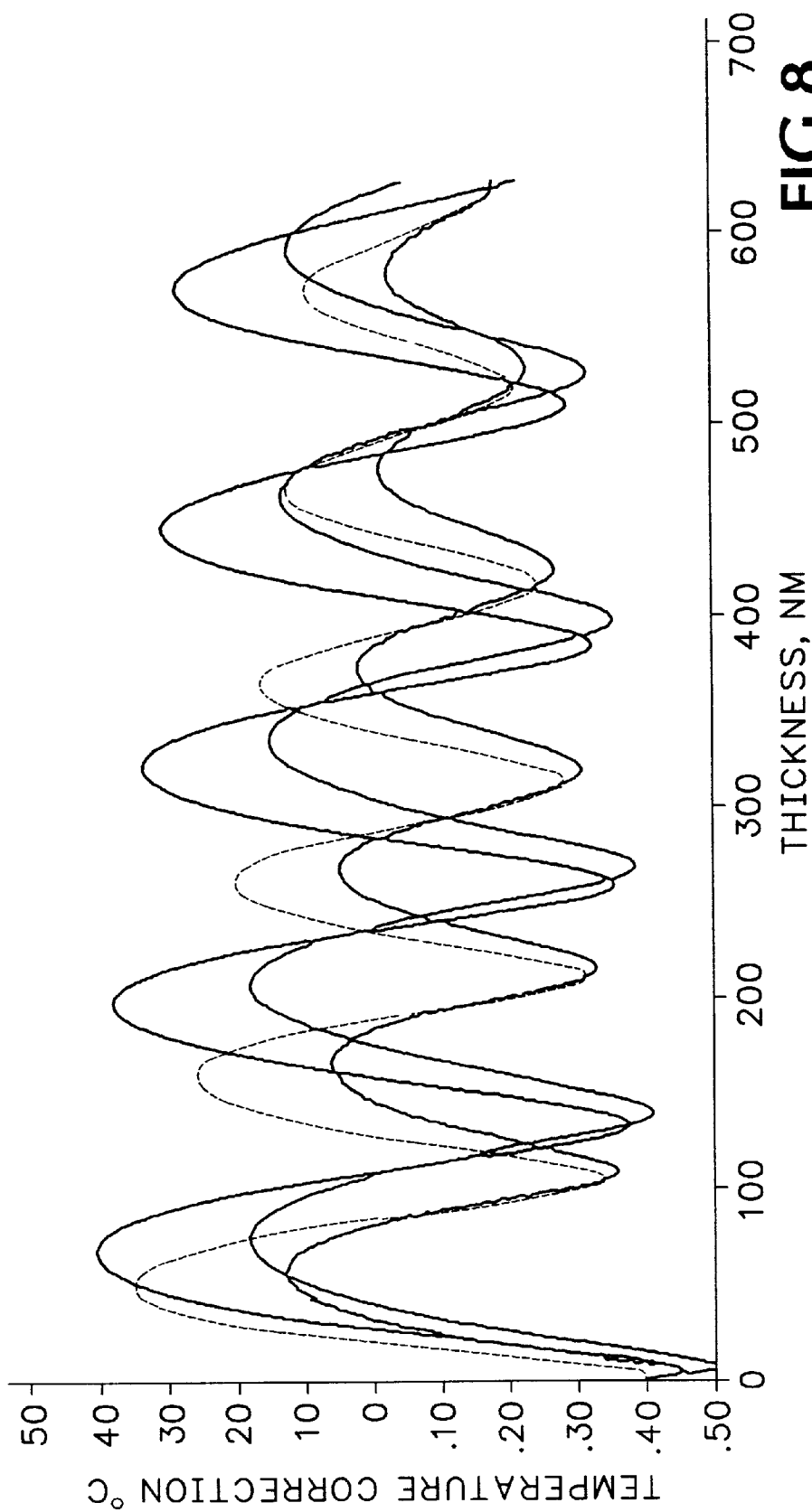
FIG. 8 is a graph of infrared correction factors, for four different wavelengths, to translate from temperature computed by multiplying infrared light intensity by a constant nominal emissivity to temperature computed by multiplying infrared light intensity by calculated emissivity.

For example, at the thickness indicated in FIG. 8, the correction to the observed temperature would be −20° C. The corrected temperature is displayed on the instrument and used to control the power to the wafer heater system.

After a particular golden wafer deposition, the unit is calibrated for a specific deposition process. A separate golden wafer is required for each process and for each process temperature. The preceding description used the infrared intensity as the parameter to be compared with an ideal value for producing an error value for the intensity adjustable heater adjustment.

Open loop control is also possible by simply using the test wafer data to correct the heat application schedule. This could be repeated until the temperature readings are close to ideal.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

Appendix 1

The analytical computer program uses a recursive programming technique to determine temperature that would be generated by a multi-configuration layered wafer.

The program starts with one light vector of unit magnitude which is emitted upward from the base material. This light vector will encounter a different material and some of the waves energy will be reflected back and some will be transmitted across the boundary and some will be absorbed while travelling through the layers. For the base layer (only) we do not care about the light energy reflected back (it just goes into maintaining the temperature of the wafer substrate). The program works by recursively following the path of each wave vector for each wavelength of the detector system simulated & each vertical profile separately.

Some basic rules:
1) Some light will be absorbed when travelling across a layer and this energy will be re-emitted.
2) The light's phase will shift when travelling across the layer.
3) The amount of light that is reflected or transmitted is dependent on the relative index of refraction of the two materials at the layer interface.
4) When light rays become very small <0.01% then we ignore the ray.
5) Light which goes downward into the base layer is lost.
6) Light which escapes the top layer will hit the detector.

More info
1) The phase shift of light travelling across a layer is dependent on its 2 PI*index of refraction*length of layer/wavelength in radians.
2) There is a PI (3.14 . . . ) phase shift of the reflective light when the index of next layer is more than the present layer.
3) Emitted light in a layer (due to absorption) is a vector of magnitude $I=emissivity*sqrt(1.0-exp(-1.0*thickness*absorption))$.
4) Snell's law states that the amount of light reflected is abs ((Index #1−Index #2)/(Index #1+Index #2)).
5) & the amount of light transmitted is sqrt (1.0−((Index #1+Index #2)/(Index #1+Index #2))^2).

An array is built for each layer which contains.
1) thickness of the layer;
2) index of refraction of the layer;
3) absorption of the layer.

Calculate some arrays for
1) Light is transmitted across each boundary.
2) Light is reflected at each boundary.
3) Light is absorbed as the light travels through the layer.
4) Phase shift imparted to light as it travels through each layer.
5) Reflected light phase shifts (note: dependent on the direction of travel).

Build some subroutines for
Travelling Rays (shifts phase & absorb light)
Edge Transition (creates 2 new rays—a transmitted one & the reflected one)
1) Launch the ray of magnitude I from the base layer.
2) On edge transition it breaks into two rays which are pushed onto a stack.
3) Pull off the stack the reflected ray & send to the travelling ray subroutine.
4) The travelling ray is in the first layer and is absorbed-end of ray.
5) Pull off the stack the transmitted ray send to the travelling ray subroutine.

Repeat this process until no rays are on the stack
Note, rays are no longer in the system whenever
1) The ray is travelling downward in the base layer.
2) The ray is travelling in the air above the top layer.
3) The ray has become very small.
4) Redo the complete process for the amount of energy that.is re-emitted (due to absorption) for each layer in the stack.
5) Add up the energy (sqrt of the sum of the vector lengths squared) of all the rays that left the top layer. That is the emissivity of the layer configuration at the measured wavelength.

We claim:
1. A method for controlling the temperature of a growing semitransparent layer during a production deposition process onto a major surface of a production wafer wherein heat is applied to said wafer by an intensity adjustable heat source, said production wafer emitting a broad spectrum of light during said process, said method comprising the steps of:
   (a) performing a test deposition process using a test wafer to create a test growing semitransparent layer, said test wafer and said test deposition process being prospectively substantially identical to said production wafer and said production deposition process;
   (b) forming a set of measurements over time of the intensity of light emissions from said growing semitransparent layer at a predetermined set of wavelengths;
   (c) using said set of measurements to determine a set of temperature values over time for said test growing semiconductor layer during said test deposition process;
   (d) using said temperature values and said light intensity values to compute a table relating, for a set of wavelength pairs formable from said set of wavelengths, a set of light intensity difference values to a value related to layer thickness;
   (e) performing said production deposition process;
   (f) measuring the light intensity at said set of wavelengths during said production deposition process;
   (g) computing production light intensity difference values for said set of wavelength pairs formable from said set of wavelengths;
   (h) using said production light intensity difference values and said table to determine a value related to the thickness of said semitransparent layer;
   (i) using said production light intensity value and said value related to layer thickness to compute an error correction value; and
   (j) using said error correction value to correct said intensity of said intensity adjustable heat source.

2. The method of claim 1 wherein the measurements of step (c) undergo interference oscillations caused by patterns of constructive and destructive infrared light interference in the growing semitransparent layer and step (c) more specifically includes the following substeps:
   (a) calculating a set of time varying interference oscillation envelope magnitude values;
   (b) using said envelope magnitude values to determine a set of time varying emissivity values; and
   (c) multiplying time coincident said emissivity values and said light intensity values to determine said set of temperature values for said growing test semiconductor layer.

3. A method for determining the coefficient of light absorptiveness of a new layer of semitransparent material on a semiconductor wafer, comprising the steps of:
   (a) measuring and recording the intensity of light emitted by the wafer during the deposition process, wherein said intensity undergoes a set of oscillations caused by the growing thickness of the growing semitransparent layer;
   (b) counting said oscillations;
   (c) determining the thickness of said growing semitransparent layer by multiplying said number of oscillations by 0.5 the wavelength of the infrared light used;

(d) calculating an envelope magnitude value for said oscillations; and (e) using said envelope magnitude value and said thickness to calculate said coefficient of light absorptiveness.

4. A method for controlling the temperature of a growing semitransparent layer during a production deposition process onto a major surface of a production wafer wherein heat is applied to said wafer by an intensity adjustable heat source, said production wafer emitting a broad spectrum of light during said process, said method comprising the steps of:

(a) performing a test deposition process using a test wafer to create a test growing semitransparent layer, said test wafer and said test deposition process being prospectively substantially identical to said production wafer and said production deposition process except for that heat is applied to said test wafer according to a test heat application schedule;

(b) forming a set of measurements over time of the intensity of light emissions from said growing semitransparent layer at a predetermined set of wavelengths;

(c) using said set of measurements to determine a set of test parameter values including temperature values over time for said test growing semitransparent layer during said test deposition process;

(d) performing said production deposition process;

(e) measuring the light intensity to form production light intensity values at said set of wavelengths during said production deposition process;

(f) using said production light intensity values and said set of test parameter values to compute an error correction value; and (g) using said error correction value to correct said intensity of said intensity adjustable heat source during said production deposition.

5. A method for determining the light absorptiveness of a new layer of semitransparent material on a semiconductor wafer, comprising the steps of:

(a) measuring and recording the intensity of infrared light emitted by the wafer during the deposition process, wherein said intensity undergoes a set of oscillations caused by the growing thickness of the growing layer;

(b) calculating an envelope magnitude value for said oscillations; and (c) using said envelope magnitude value to calculate said light absorptiveness.

6. A method of post deposition analysis for determining the temperature versus time curve of a growing semitransparent layer, wherein a set of infrared intensity values over time are measured during the deposition process and the single wavelength light intensity undergoes interference oscillations, said method comprising:

(a) determining the temperature values at the interference oscillation maxima; and (b) interpolating temperature values between the interference oscillation maxima.

* * * * *